(12) United States Patent
Franck et al.

(10) Patent No.: US 7,405,624 B2
(45) Date of Patent: Jul. 29, 2008

(54) CLASS AB SOURCE FOLLOWER

(75) Inventors: Stephen J. Franck, Felton, CA (US); Ranganathan Desikachari, San Jose, CA (US); Matthew Clapp, Mountain View, CA (US)

(73) Assignee: Agere Systems Inc.

( * ) Notice: Subject to any disclaimer, the term of this patent is extended or adjusted under 35 U.S.C. 154(b) by 228 days.

(21) Appl. No.: 11/402,760

(22) Filed: Apr. 11, 2006

(65) Prior Publication Data

US 2007/0236291 A1 Oct. 11, 2007

(51) Int. Cl.
H03F 3/18 (2006.01)
H03F 3/26 (2006.01)
(52) U.S. Cl. .................................. 330/264; 330/267
(58) Field of Classification Search .................. 330/264
See application file for complete search history.

(56) References Cited

U.S. PATENT DOCUMENTS

| 4,598,253 | A | * | 7/1986 | Reindel et al. ............... 330/253 |
|---|---|---|---|---|
| 4,728,903 | A | * | 3/1988 | Reiffin ........................ 330/264 |
| 5,343,166 | A | * | 8/1994 | Pass ........................... 330/264 |
| 5,357,211 | A | * | 10/1994 | Bryson et al. ................ 330/263 |
| 5,467,050 | A | * | 11/1995 | Clapp et al. .................. 327/530 |
| 6,509,722 | B2 | * | 1/2003 | Lopata ........................ 323/280 |
| 6,683,492 | B2 | * | 1/2004 | Krishnapura et al. ......... 327/552 |
| 7,242,252 | B2 | * | 7/2007 | Taylor ........................ 330/296 |

OTHER PUBLICATIONS

P.R. Gray, R. G. Meyer, S. Lewis, and P. Hurst; "Analysis and Design of Analog Integrated Circuits." 4th Ed., 2001, pp. 213-215.
Jing-Hong Conan Zhan, Stewart S. Taylor, "A 5GHz Resistive-Feedback CMOS LNA for Low-Cost Multi-Standard Applications," 2006 IEE International Solid-State Circuits Conference; pp. 200-201; 648.

* cited by examiner

*Primary Examiner*—Robert J. Pascal
*Assistant Examiner*—Krista M Flanagan
(74) *Attorney, Agent, or Firm*—Hamilton, DeSanctis & Cha

(57) ABSTRACT

Various source follower circuits and methods for implementing such are disclosed. As one example, a class AB source follower circuit is disclosed that includes a source follower circuit that is actively biased. The dynamic biasing allows the source follower circuit to sustainably sink a DC current. In some instances of the embodiments, the class AB source follower circuits are operable to source and sink both AC and DC currents.

20 Claims, 8 Drawing Sheets

CLASS AB SOURCE FOLLOWER

BACKGROUND OF THE INVENTION

The present invention is related to systems and methods for implementing source follower circuits. More particularly, the present invention is related to class AB source follower circuits.

Source follower circuits are known in the art, however, known source follower circuits suffer from one or more deficiencies. As an example, one existing source follower circuit 100 is depicted in FIG. 1. Source follower circuit 100 includes four transistors 115, 120, 125, 130 each with a source (labeled 's'), a drain (labeled 'd') and a gate (labeled 'g'). The gate of transistor 120 is connected to a voltage input 155; the source of transistor 120 is attached to the drain of transistor 115, the drain of transistor 130, and a resistor 145; and the drain of transistor 120 is connected to a capacitor 135, the gate of transistor 130, and the drain of transistor 125. In addition, the gate of transistor 125 is connected to a resistor 140, which is attached to a first bias voltage 150; and the source of transistor 125 is connected to a power source. The gate of transistor 130 is connected to capacitor 135, the drain of transistor 125, and the drain of transistor 120; and the source of transistor 130 is connected to the power source. The gate of transistor 115 is connected to capacitor 135 and to a resistor 110 that connected to a second bias voltage 160; and the source of transistor 115 is connected to a ground. An output end of resistor 145 is connected to a voltage output 165 at a node 175.

Source follower circuit 100 operates well where you have a capacitive load connected to node 175 or where you have a pure AC input. However, if there is added DC load at node 175, there cannot be a corresponding DC current to the gate of transistor 115 because of capacitor 135, and thus the voltage at the gate of transistor 115 is equal to bias voltage 160. In this case, the DC load at node 175 will be greater than the quiescent current, and source follower circuit 100 is not capable of sinking sustained current greater than the quiescent current $I_1$ as the DC voltage across resistor 145 decays to zero. It should be noted that source follower circuit 100 may be able to provide some sink current, but on an inconsistent basis during transient operation and for a period shorter than the RC time constant defined by resistor 110 and the gate capacitance of transistor 115. Said another way, source follower circuit 100 is not capable of providing a sustained current greater than $I_1$ via resistor 145.

Hence, for at least the aforementioned reasons, there exists a need in the art for advanced circuits capable of a broader range of operation.

BRIEF SUMMARY OF THE INVENTION

The present invention is related to systems and methods for implementing source follower circuits. More particularly, the present invention is related to class AB source follower circuits.

Some embodiments of the present invention provide compound source follower circuits that include an input transistor, a positive drive transistor and a negative drive transistor. The gate of the input transistor is electrically coupled to an input, and an output is electrically coupled to both the negative drive transistor and to the positive drive transistor. In addition, the circuits include capacitor that couples the negative drive transistor to the positive drive transistor. Further, a dynamic bias circuit is included that is operable to maintain a voltage difference between the positive drive transistor and the negative drive transistor under changes in quiescent load. In some cases, the circuits include a high impedance load that is operable to provide a controlled quiescent current to the input transistor.

Various embodiments of the present invention provide class AB source follower circuits that include a source follower circuit that is actively biased. The dynamic biasing allows the source follower circuit to sustainably sink a DC current. In some instances of the embodiments, the class AB source follower circuits are operable to source and sink both AC and DC currents. In particular instances of the aforementioned embodiments a capable of providing an output current greater than the quiescent current.

In some instances of the aforementioned embodiments, the source follower circuit is biased with a bias circuit that includes both a class AB bias circuit and a replica circuit. In such instances, the replica circuit is operable to provide a bias signal to the class AB bias circuit. In various cases, the class AB bias circuit includes six transistors electrically coupled to provide a positive drive, a negative drive, and an output bias to the source follower circuit. In particular cases, the class AB bias circuit further includes one or more transistors operable to disable the class AB bias circuit when a sleep mode is selected, and one or more transistors operable to delay operation of the class AB bias circuit until some time period after the sleep mode is unselected.

In some cases, the replica circuit includes nine transistors electrically coupled to provide the replica bias for the class AB bias circuit. In particular cases, the replica circuit further includes one or more transistors operable to disable the replica circuit when a sleep mode is selected, and one or more transistors operable to delay operation of the replica circuit until some time period after the sleep mode is unselected.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
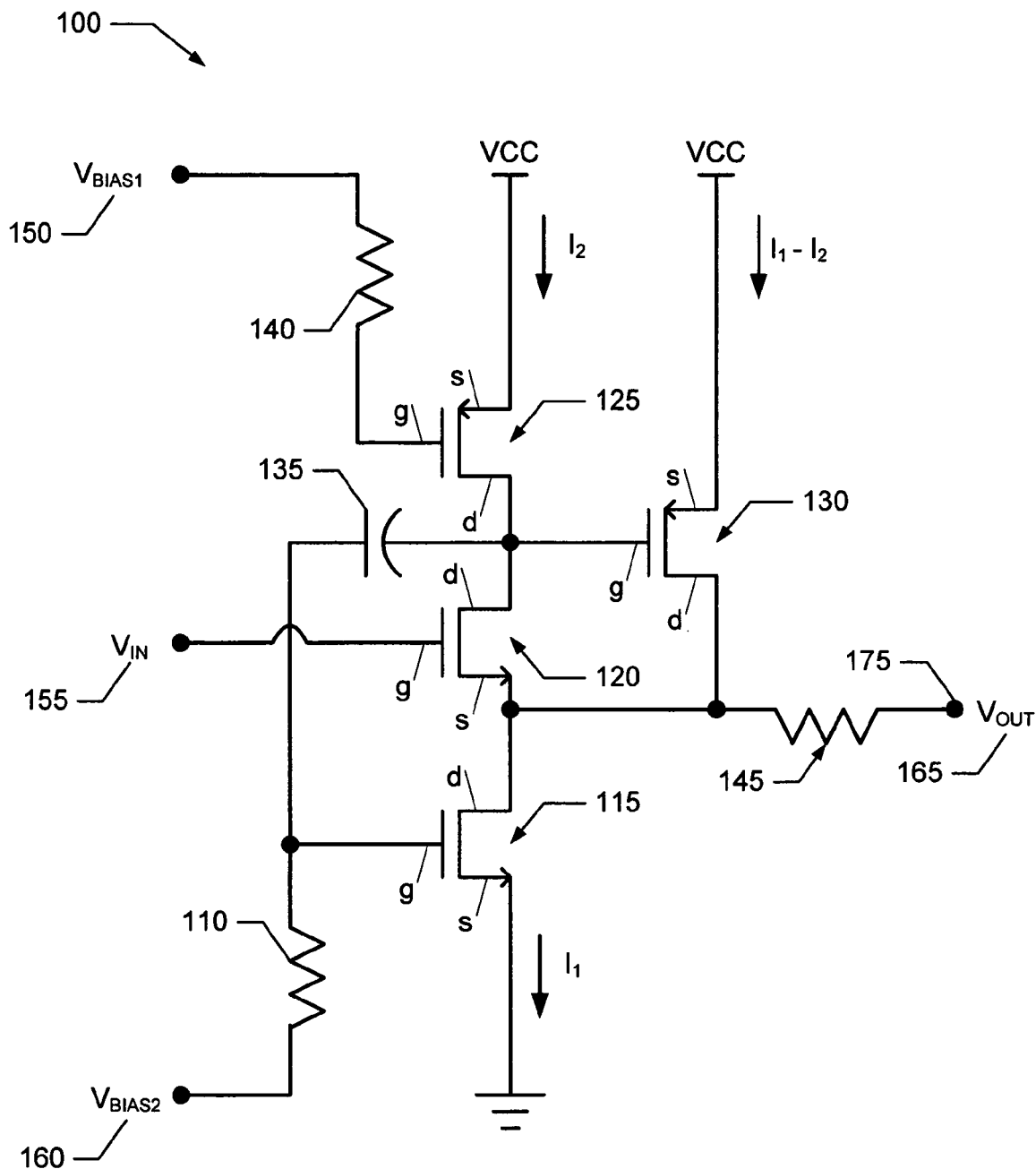
FIG. 1 depicts a known source follower circuit.

The present invention is related to systems and methods for implementing source follower circuits. More particularly, the present invention is related to class AB source follower circuits.

Various embodiments of the present invention provide class AB source follower circuits that include a source follower circuit that is actively biased. The dynamic biasing allows the source follower circuit to sustainably sink a DC current. In some instances of the embodiments, the class AB source follower circuits are operable to source and sink both AC and DC currents. In some cases, such circuits may be used to drive low frequency patterns where control of the quiescent current with fast recovery is desired. Such circuits may be particularly applicable to perpendicular recording in a disk drive where long sequences of DC voltage values with minimal bias may be desired. In particular instances of the embodiments, class AB source followers capable of operation between three hundred Megahertz and three Gigahertz using biasing in the microamp range, and yet capable of reliably sinking and sourcing an output current in the milliamp range with low distortion. Thus, some embodiments of the present invention provide a generic low power source follower buffer with high fidelity and broad operating band.

Particular embodiments of the present invention provide source follower circuits that are capable of driving low impedance output loads while buffering signals without substantially changing the frequency response or substantially degrading the linearity of the input signal. Further, some embodiments of the present invention provide sinking and sourcing capability depending upon the direction of the input signal swing with phase control on the drive signals to minimize power consumption. In some cases, one or more embodiments of the present invention can be tailored to drive loads an order of magnitude higher than the quiescent current of the source follower circuit. This may be relied upon to introduce only minimal distortion while buffering very high rate data signals. In some of the circuits, capacitive coupling provides a complementary in phase PMOS and NMOS drive, canceling out the square law effects of each MOS device by the opposite effect in the other device. In various cases, one or more of the circuits described herein may be configured to operate as a feedback source follower with one or more of the aforementioned advantages.

As used herein, the phrase "electrically coupled" is used in its broadest sense to mean any form of coupling whereby an electrical signal may be transferred from one device to another. Thus, an electrical coupling may be, but is not limited to, coupling via a conductive wire, coupling via a resistor, coupling via a capacitor, coupling via an inductor, coupling via a transistor, any combination of the aforementioned, and/or the like. Further, it should be noted that various particular transistor types are used herein to describe exemplary embodiments of the present invention, but that one of ordinary skill in the art will recognize that other transistor types may be used to implement circuits conforming to other embodiments of the present invention. Thus, for example, one of ordinary skill in the art will recognize that some circuits implemented with NMOS transistors may also be implemented using PMOS transistors, and vice versa. Further, in some cases, bipolar transistors may be used in relation to various embodiments of the present invention.

Figure 2A:
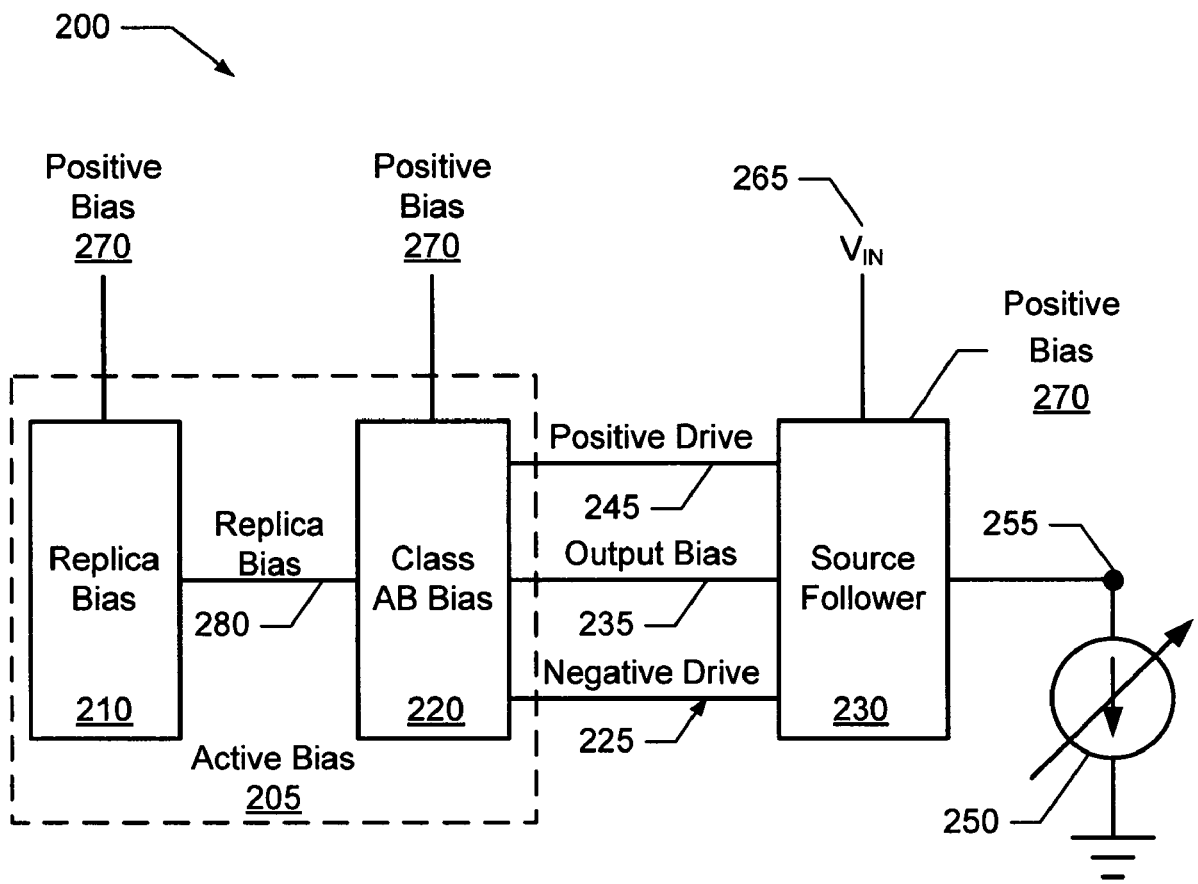
FIGS. 2a-2d depict a source follower circuit in accordance with one or more embodiments of the present invention.

Turning to FIG. 2a, a class AB source follower circuit 200 in accordance with one or more embodiments of the present invention is illustrated. Class AB source follower circuit 200 includes a source follower circuit 230 that provides a voltage output 255 that is representative of a voltage input 265. Source follower circuit 230 is electrically coupled to an active bias circuit 205 via a positive drive signal 245, a negative drive signal 225 and an output bias signal 235. Further, source follower 230 drives a variable load 250 as represented by a variable current source. It should be noted that other variable loads may be driven. Active bias circuit 205 includes a class AB bias circuit 220 that is electrically coupled to a replica bias circuit 210 via a replica bias signal 215. Each of replica bias 210, class AB bias 220 and source follower 230 include a positive bias input 270. An exemplary implementation of each of source follower circuit 230, class AB bias circuit 220 and replica bias circuit 210 are provided in FIGS. 2b-2d. Other exemplary implementations of class AB bias circuit 220 and replica bias circuit 210 are provided in FIGS. 3a-3c.

Figure 2B:
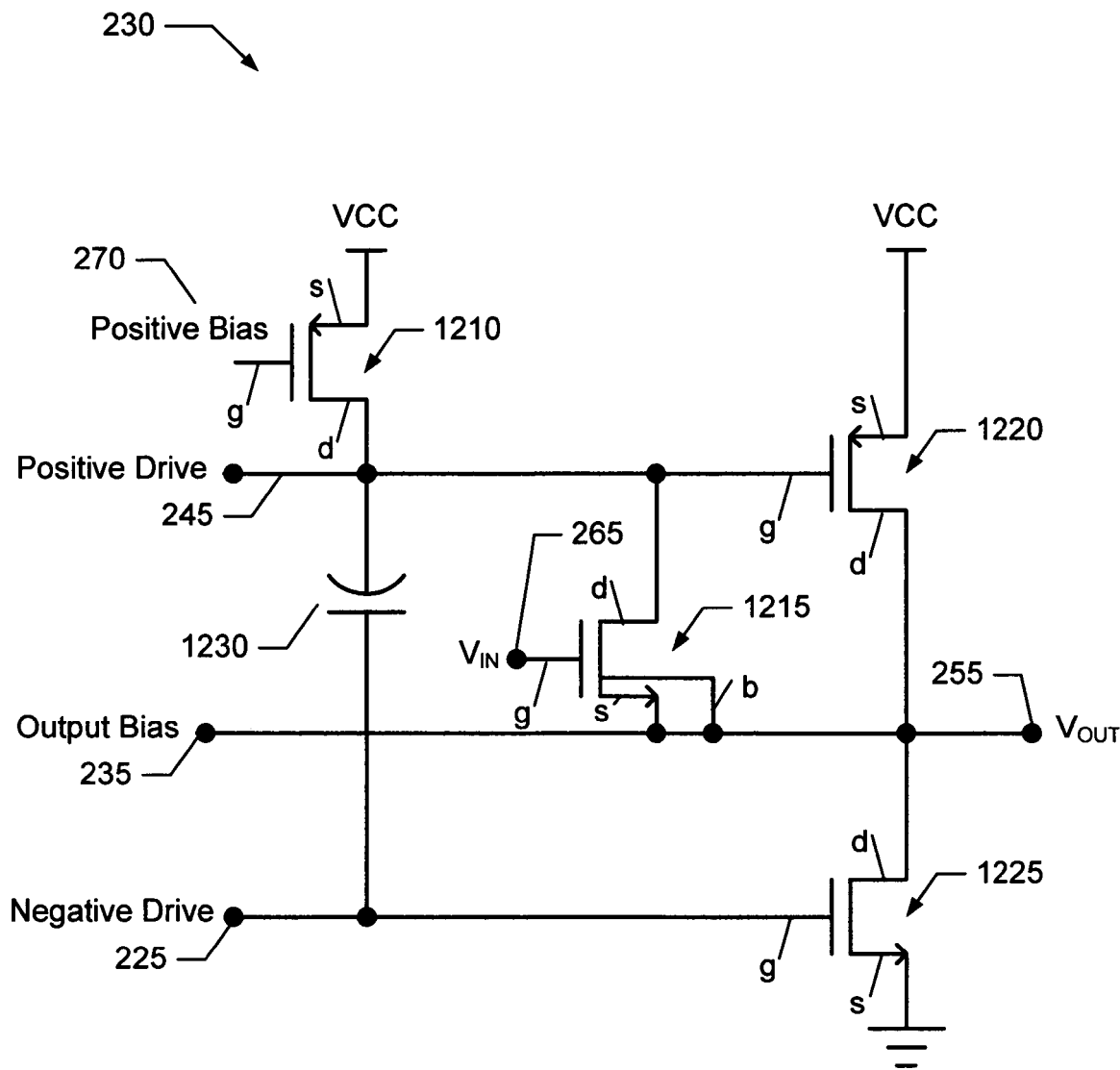

Turning now to FIG. 2b, one embodiment of source follower circuit 230 is depicted in accordance with some embodiments of the present invention. In the embodiment, source follower 230 includes transistors 1210, 1215, 1220, 1225 each with a source (labeled 's'), a drain (labeled 'd') and a gate (labeled 'g'). The gate of transistor 1210 is electrically coupled to a positive bias 270. In some cases, positive bias 270 is approximately one VT below VCC (i.e., VCC—VT). The source of transistor 1210 is electrically coupled to a power supply, and the drain of transistor 1210 is electrically coupled to positive drive 245 and a capacitor 1230. The other side of capacitor 1230 is electrically coupled to negative drive 225. Connected as such, transistor 1210 operates as a current source. In one particular embodiment, the current traversing transistor 1210 is approximately twenty-five microamps. Further, capacitor 1230 electrically couples the gate of transistor 1220 to the gate of transistor 1225 thereby producing a complementary drive at high frequencies. Class AB bias circuit 220 sets up a DC voltage across capacitor 1230. Together, transistor 1220 and transistor 1225 provide a large bidirectional current drive capability with low quiescent current for optimal efficiency. Capacitor 1230 also provides a coupling at high frequencies between the respective gates of transistors 1220, 1225 allowing the two complementary transistors 1220, 1225 to operate as though they were a single highly linear, highly efficient bidirectional driver. In some cases, transistor 1220 is referred to as a "positive drive transistor" and transistor 1225 is referred to as a "negative drive transistor".

The drain of transistor 1210 is also electrically coupled to the gate of transistor 1220, and to the drain of transistor 1215. Transistor 1215 is self tubbed with the body (labeled 'b') thereof electrically coupled to the source. The gate of transistor 1215 is electrically coupled to voltage input 265. The source of transistor 1215 is electrically coupled to output bias 235, and voltage output 255. Voltage output 255 is also electrically coupled to the drain of transistor 1220 and to the drain of transistor 1225. The source of transistor 1225 is electrically coupled to ground, and the gate thereof is electrically coupled to negative drive 225. The source of transistor 1220 is electrically coupled to the power source.

Figure 2C:
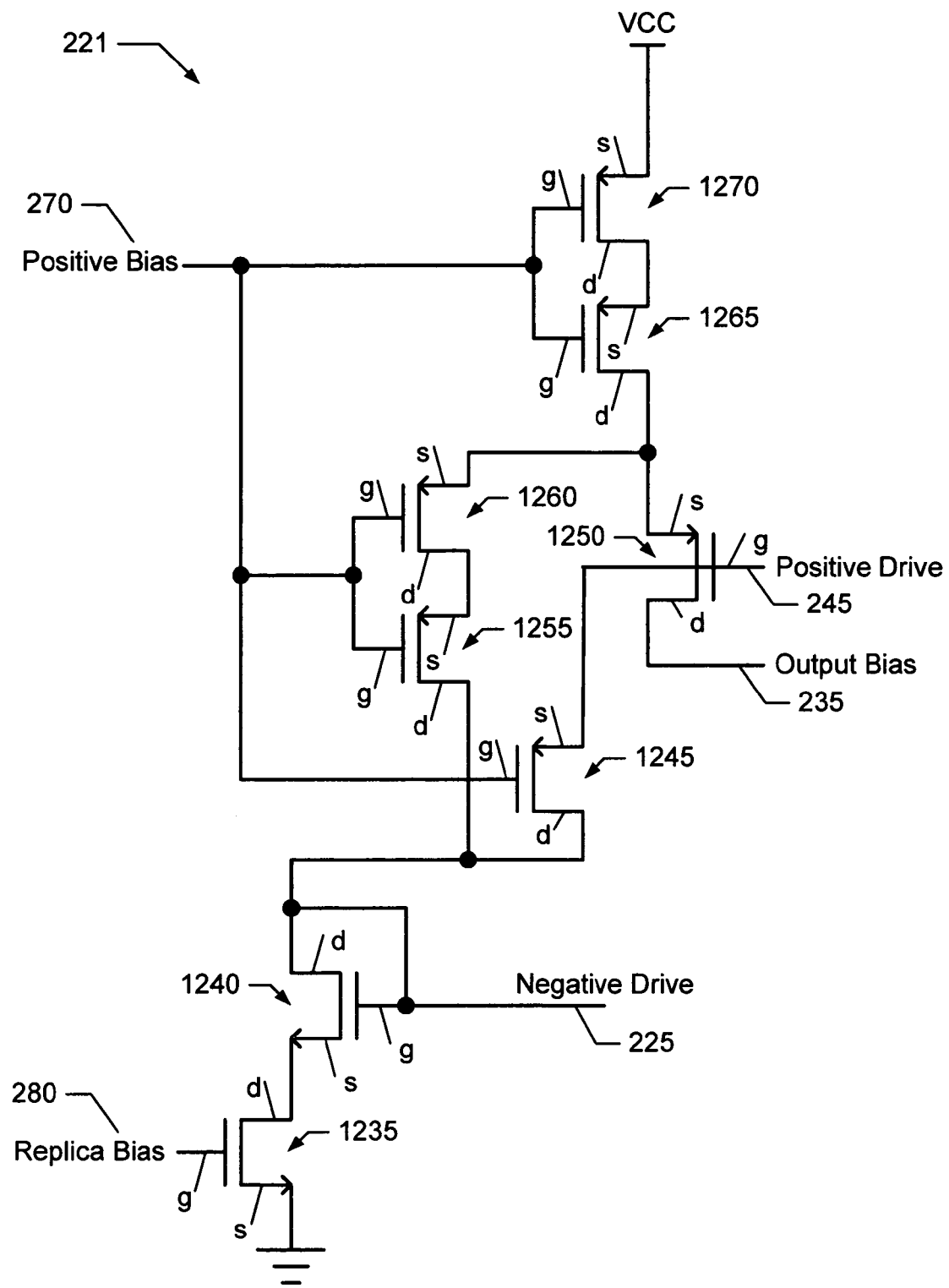

Turning to FIG. 2c, details of a class AB bias circuit 221 in accordance with various embodiments of the present invention is depicted. Of note, replica bias 280 is an input to class AB bias circuit 221 that is provided from a replica circuit 222 as is further discussed in relation to FIG. 2d below. Class AB bias circuit includes transistors 1235, 1240, 1245, 1250, 1255, 1260, 1265, 1270 each with a source (labeled 's'), a drain (labeled 'd') and a gate (labeled 'g'). The gate of transistor 1235 is electrically coupled to replica bias 280 from replica circuit 222, and the source of transistor 1235 is electrically coupled to ground. Transistor 1240 is diode connected with the gate and the drain of transistor 1240 electrically coupled together, and the source of transistor 1240 electrically coupled to the drain of transistor 1235. The gate of transistor 1240 is also electrically coupled to negative drive 225, and the drain of transistor 1240 is electrically coupled to the drain of transistor 1255 and the drain of transistor 1245.

The combination of transistors 1245, 1250, 1255, 1260 combine to form a non-inverting path between negative drive transistor 1225 and positive drive transistor 1220 such that at low frequencies the core source follower continues to operate as a class AB source follower. At high frequencies, capacitor 1230 provides a similar path. Thus, the circuit offers a constant gm as positive driver 1220 and negative driver 1225 are coupled via the capacitor at high frequencies and via the aforementioned transistor path at low frequencies. Thus, for example, when the Gm of positive driver 1220 is increasing, the Gm of the negative driver 1225 is decreasing such that the overall Gm of positive driver 1220 and negative driver 1225 remains approximately constant under changes in load.

Transistor 1255 and transistor 1260 operate together as a pair for matching purposes. Based on FIG. 2c, one of ordinary skill in the art will recognize that the transistor pair 1255, 1260 may be replaced by a single transistor if desired. The gates of both transistor 1255 and transistor 1260 are electrically coupled to positive bias 270, and the drain of transistor 1260 is electrically coupled to the source of transistor 1255. The source of transistor 1260 is electrically coupled to the source of transistor 1250 and to the drain of transistor 1265. Transistor 1265 and transistor 1270 operate together as a pair for matching purposes. Based on FIG. 2c, one of ordinary skill in the art will recognize that the transistor pair 1265, 1270 may be replaced by a single transistor if desired. The gates of both transistor 1265 and transistor 1270 are electrically coupled to positive bias 270, the drain of transistor 1270 is electrically coupled to the source of transistor 1265, and the source of transistor 1270 is electrically coupled to the power supply.

The gate of transistor 1250 is electrically coupled to the source of transistor 1245, and to positive drive 245. The drain of transistor 1250 is electrically coupled to output bias 235. The gate of transistor 1245 is electrically coupled to positive bias 270.

Transistor 1250 is connected in a source follower configuration with output voltage 255 operating as the supply voltage for the source follower configuration represented by transistor 1250. Any current traversing transistor 1250 is in parallel to transistor 1220 of source follower 230. Thus, transistor 1250 operates as a helper circuit to transistor 1220, but is current limited by transistors 1265, 1270. Transistor 1250 acts a current steering device passing current to either source current (i.e., passing current to output bias 235) or to sink current (i.e., passing current to negative drive 225) as more fully described below.

Transistor 1240 is similar to transistor 1225 of source follower 230, and together they operate as a current mirror. However, this current mirror is not a one to one current mirror because transistor 1235 is capable of sinking only a relatively small current. For example, where transistors 1265, 1270 are capable of supplying a five microamp current, transistor 1235 may only be capable of sinking one microamp of current. Thus, where positive drive 245 is greater than positive bias 270, transistor 125 will be turned off and all of the current from transistors 1265, 1270 is steered through transistors 1255, 1260 to transistors 1240, 1235. However, transistor 1235 is not capable of passing that level of steered current, and therefore negative drive 225 will increase causing transistor 1225 of source follower 230 to turn on. In its on state, transistor 1225 is operable to sink substantial current to node 255. Thus, class AB bias circuit 221 is operable to cause source follower 230 to both source and sink DC currents. In addition, it is operable to cause source follower to both source and sink AC currents as capacitor 1230 does not inhibit AC operation like it does DC operation.

Transistor 1245 is part of an optional vigilant circuit that is almost always off, but is operable to increase bias currents to deal with alarm conditions occurring in relation to high voltage swings. In particular, it is possible for positive drive 245 to exceed positive bias 270 by approximately one VT above positive bias 270 (i.e., very near VCC). In such a condition, transistor 1210 of source follower 230 is in saturation. At approximately this same time, transistor 1245 turns on providing additional current to negative drive 225 resulting in a sinking current to output node 255. This stabilizes the circuit outside of the alarm condition.

Figure 2D:
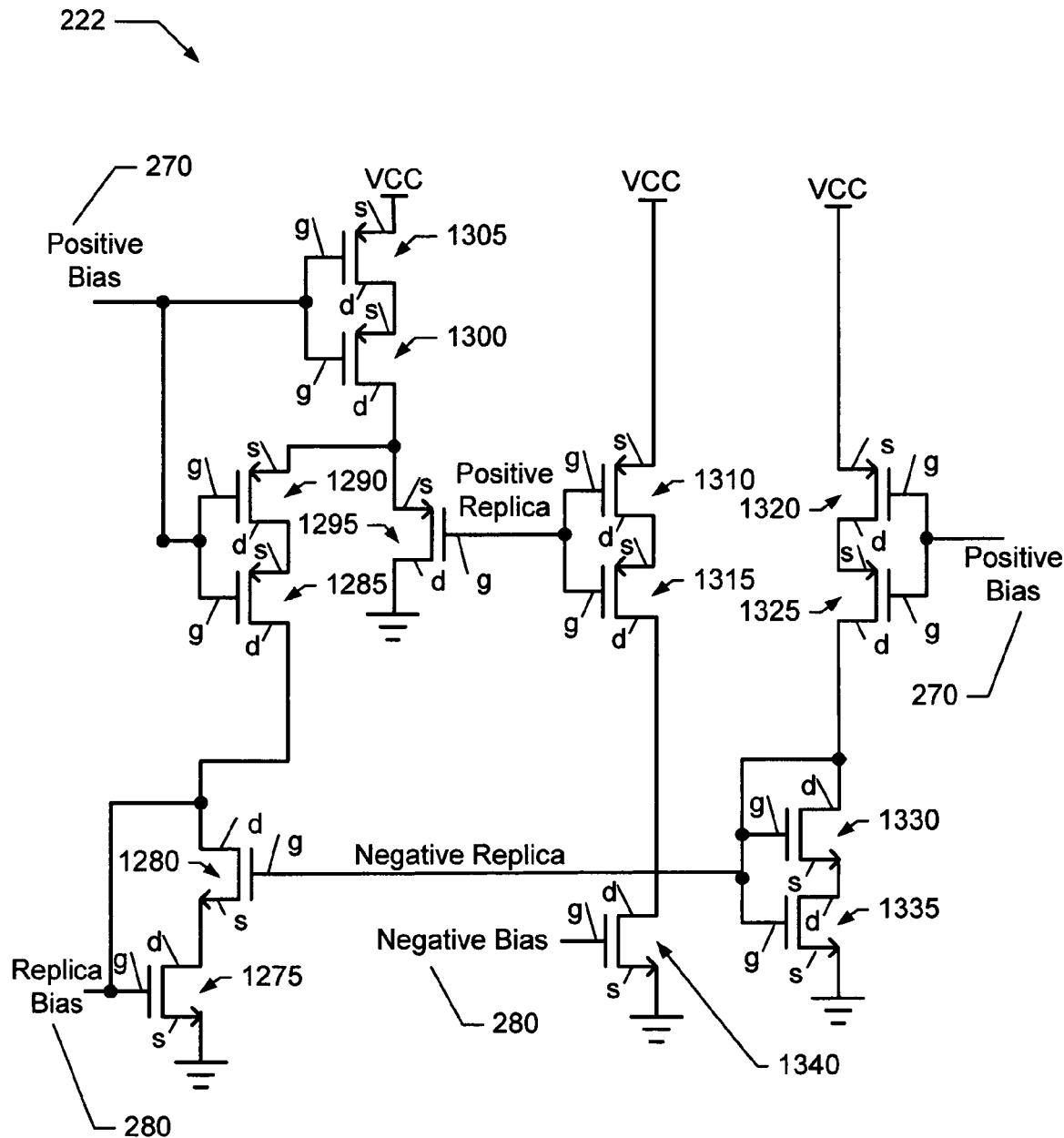

FIG. 2d shows the details of a replica circuit 222 in accordance with some embodiments of the present invention. Replica circuit 222 is substantially a copy of transistors in source follower circuit 230 and class AB bias circuit 221 with the transistors operating at know quiescent currents. The output of replica circuit 222 is replica bias 280 which is provided to class AB bias circuit 221. Replica bias 280 in part sets the quiescent level in source follower circuit 230 when there is no load at node 255. In particular, replica bias 280 adjusts the quiescent ratio of the current mirror that includes 1225, 1240.

Replica circuit 222 includes transistors 1275, 1280, 1285, 1290, 1295, 1300, 1310, 1315, 1320, 1325, 1330, 1335, 1340 each with a source (labeled 's'), a drain (labeled 'd') and a gate (labeled 'g'). The gate of transistor 1275 is electrically coupled to replica bias 280 that is provided to class AB bias circuit 221, and to the drain of transistor 1280. The source of transistor 1275 is electrically coupled to ground, and the drain of transistor 1275 is electrically coupled to the source of transistor 1280. The drain of transistor 1280 is electrically coupled to the drain of transistor 1285, and the gate of transistor 1280 is electrically coupled to the gate of transistor 1330, the gate of transistor 1335, and the drain of transistor 1330.

Transistor 1285 and transistor 1290 operate together as a pair for matching purposes. Based on FIG. 2d, one of ordinary skill in the art will recognize that the transistor pair 1285, 1290 may be replaced by a single transistor if desired. The gates of both transistor 1285 and transistor 1290 are electrically coupled to positive bias 270, and the drain of transistor 1290 is electrically coupled to the source of transistor 1285. The source of transistor 1290 is electrically coupled to the drain of transistor 1300 and to the source of transistor 1295. Transistor 1300 and transistor 1305 operate together as a pair for matching purposes. Again, based on FIG. 2d, one of ordinary skill in the art will recognize that the transistor pair 1300, 1305 may be replaced by a single transistor if desired. The gates of both transistor 1300 and transistor 1305 are electrically coupled to positive bias 270, and the source of transistor 1305 is electrically coupled to the power supply. The drain of transistor 1305 is electrically coupled to the source of transistor 1300.

The gate of transistor 1295 is electrically coupled to the gate of transistor 1310 and the gate of transistor 1315. The drain of transistor 1295 is electrically coupled to ground. Transistor 1310 and transistor 1315 operate together as a pair for matching purposes. Again, based on FIG. 2d, one of ordinary skill in the art will recognize that the transistor pair 1310, 1315 may be replaced by a single transistor if desired. The source of transistor 1310 is electrically coupled to the power supply, the drain of transistor 1310 is electrically coupled to the source of transistor 1315, and the drain of transistor 1315 is electrically coupled to the drain of transistor 1340. The source of transistor 1340 is electrically coupled to ground, and the gate of transistor 1340 is electrically coupled to a negative bias 280. In some cases, negative bias 280 is approximately one VT above ground (i.e., VT).

Transistor 1330 and transistor 1335 operate together as a pair for matching purposes. Again, based on FIG. 2d, one of ordinary skill in the art will recognize that the transistor pair 1330, 1335 may be replaced by a single transistor if desired. The source of transistor 1335 is electrically coupled to ground, the drain of transistor 1335 is electrically coupled to the source of transistor 1330, and the drain of transistor 1330 is electrically coupled to the drain of transistor 1325. Transistor 1320 and transistor 1325 operate together as a pair for matching purposes. Again, based on FIG. 2d, one of ordinary skill in the art will recognize that the transistor pair 1320, 1325 may be replaced by a single transistor if desired. The source of transistor 1320 is electrically coupled to the power supply, the drain of transistor 1320 is electrically coupled to the source of transistor 1325, and the gate of both transistors 1320, 1325 are electrically couple to positive bias 270.

Figure 3A:
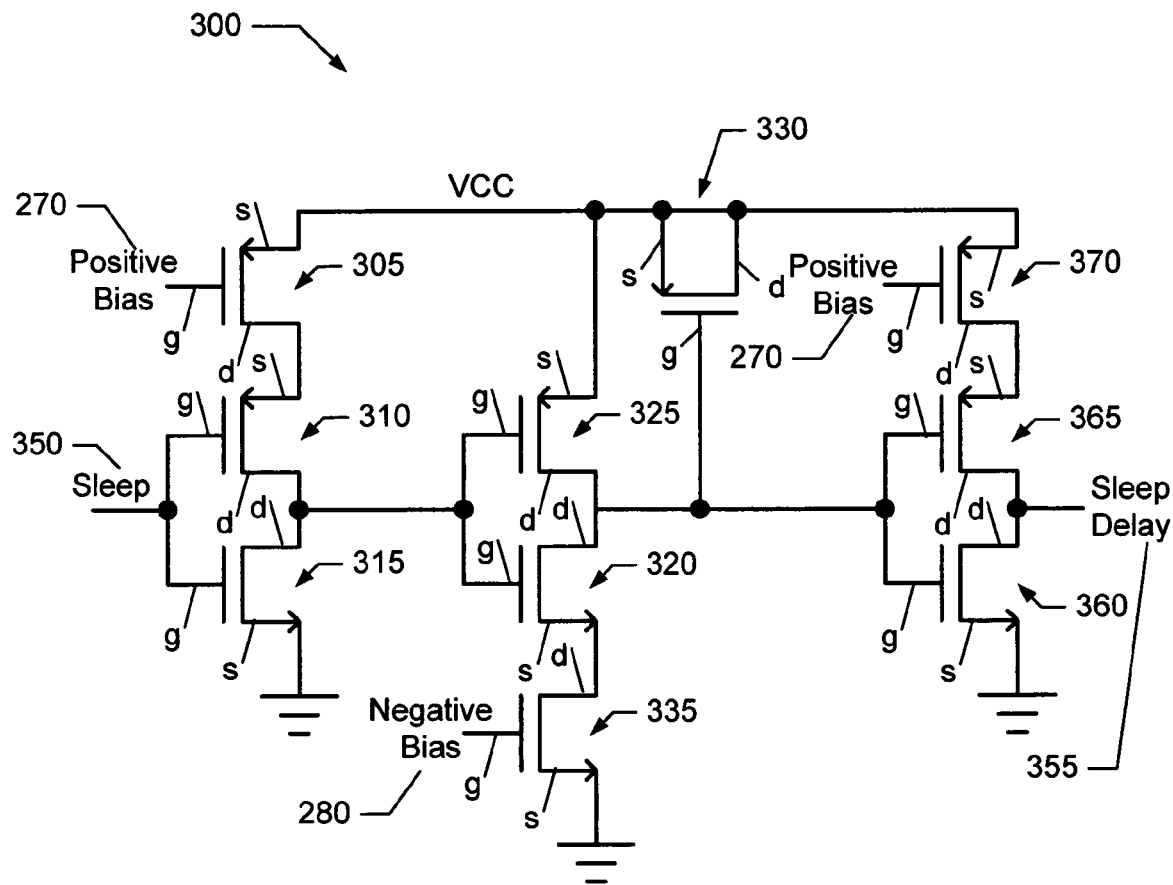
FIGS. 3a-3c depict augmented source follower circuitry in accordance with various embodiments of the present invention.

Turning to FIG. 3a, a delay circuit 300 operable to delay a sleep control signal 350 that may be used in relation to one or more embodiments of the present invention is shown. In operation, delay circuit 300 receives a sleep control signal 350 that is asserted high whenever a sleep mode is desired. Delay circuit 300 passes sleep control signal 350 through three buffer stages and outputs a sleep delay signal 355. This delayed sleep signal may be used in various of the circuitry as further discussed in relation to FIGS. 3b and 3c to assure stable operation. In operation, when sleep control signal 350 is asserted high, sleep delay signal 355 asserts high almost immediately. In contrast, when sleep control signal 350 asserts low, sleep delay signal 355 asserts low only after negative bias 280 becomes active.

Delay circuit 300 includes transistors 305, 310, 315, 320, 325, 330, 335, 360, 365, 370 each with a source (labeled 's'), a drain (labeled 'd') and a gate (labeled 'g'). The source of transistor 305 is electrically coupled to the power supply, the gate of transistor 305 is electrically coupled to positive bias 305, and the drain of transistor 305 is electrically coupled to the source of transistor 310. The source of transistor 315 is electrically coupled to ground, and the drain of transistor 315 is electrically coupled to the drain of transistor 310. The gate of transistor 310 and the gate of transistor 315 are electrically coupled to sleep control signal 350.

The drain of transistor 310 and the drain of transistor 315 are electrically coupled to both the gate of transistor 325 and the gate of transistor 320. The drain of transistor 320 is electrically coupled to the drain of transistor 325, the source of transistor 325 is electrically coupled to the power supply, and the source of transistor 320 is electrically coupled to the drain of transistor 335. The gate of transistor 335 is electrically coupled to negative bias 280 and the source of transistor 335 is electrically coupled to ground.

The drain of transistor 325 and the drain of transistor 320 are electrically coupled to both the gate of transistor 365 and the gate of transistor 360. The drain of transistor 365 and the drain of transistor 360 are electrically coupled to one another, and to a sleep delay output 355. The source of transistor 360 is electrically coupled to ground, and the source of transistor 365 is electrically coupled to the drain of transistor 370. The gate of transistor 370 is electrically coupled to positive bias 270, and the source of transistor 370 is electrically coupled to the power supply. The drain and the source of transistor 330 are electrically coupled to the power supply, and the gate of transistor 330 is electrically coupled to the drains of transistors 320, 325 and to the gates of transistors 360, 365.

Figure 3B:
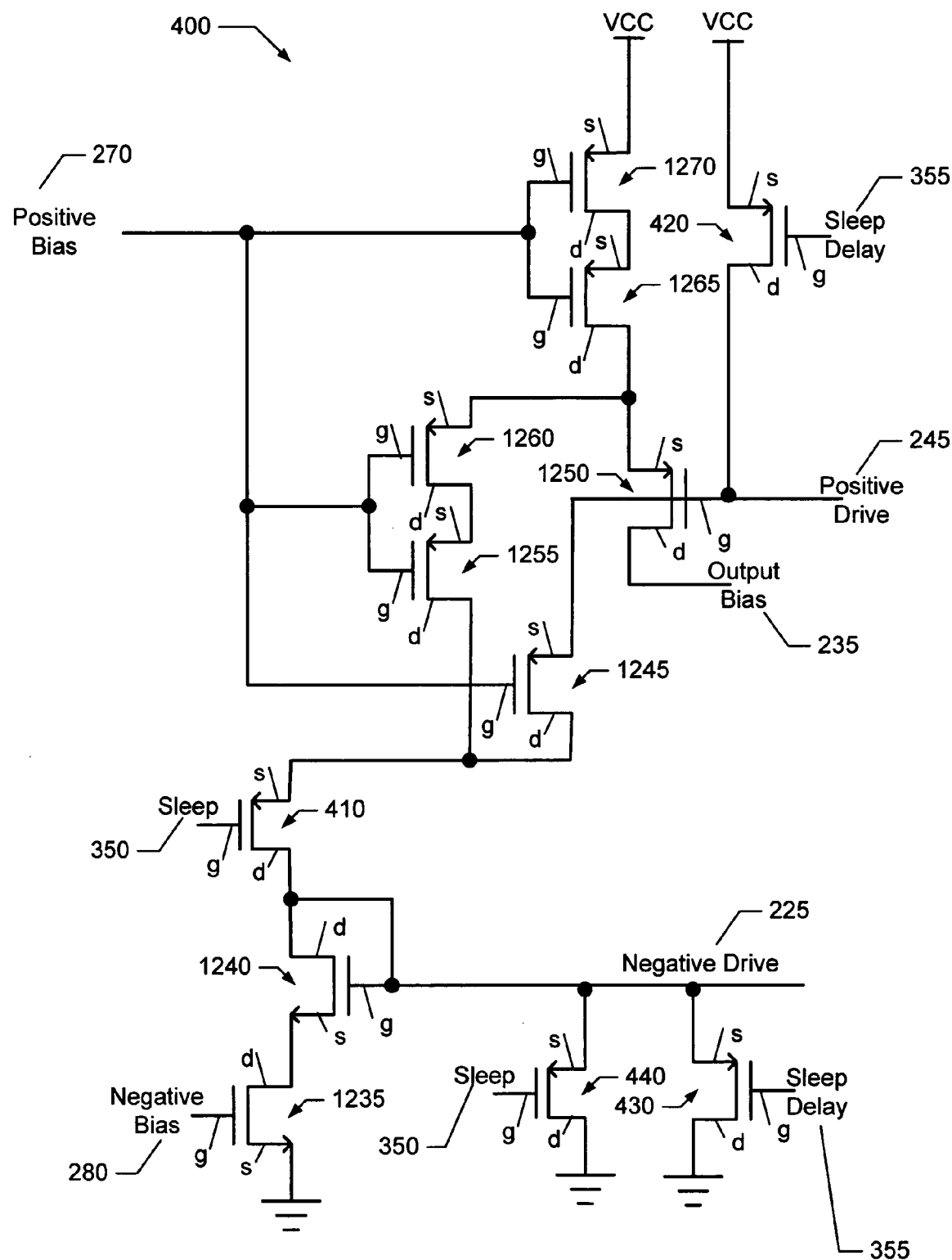

Turning to FIG. 3b, an alternative class AB bias circuit 400 in accordance with other embodiments of the present invention is depicted. Class AB bias circuit includes transistors 1235, 1240, 1245, 1250, 1255, 1260, 1265, 1270 as previously described in relation to class AB bias circuit 221, and additionally transistors 410, 420, 430, 440 each with a source (labeled 's'), a drain (labeled 'd') and a gate (labeled 'g').

Transistor 410 and transistor 440 are used to disable class AB bias circuit 400 whenever sleep control signal 350 is asserted high. In particular, transistor 410 is electrically coupled between the drains of transistors 1245, 1255, and the drain of transistor 1240. Transistor 440 is electrically coupled between the gate of transistor 1240 and ground. When transistor 440 is turned on, transistor 1225 of source follower 230 is turned off. Similarly, when transistor 410 is turned on, charging of source follower circuit 230 is stopped.

Transistor 420 and transistor 430 are operable to assure stability of class AB bias circuit 400 as sleep control signal 350 (via sleep delay 355) is transitioned from an asserted state to a de-asserted state (i.e., as class AB circuit 400 is transitioned to an operational state from a sleep state). In particular, transistor 420 is electrically coupled between the power supply and the gate of transistor 1250. Transistor 430 is electrically coupled between the gate of transistor 1240 and ground. The use of sleep delay signal 355 prevents transistor 1235 from entering a break down state as it remains asserted high causing negative drive 225 to be pulled low until negative bias 280 becomes active.

Figure 3C:
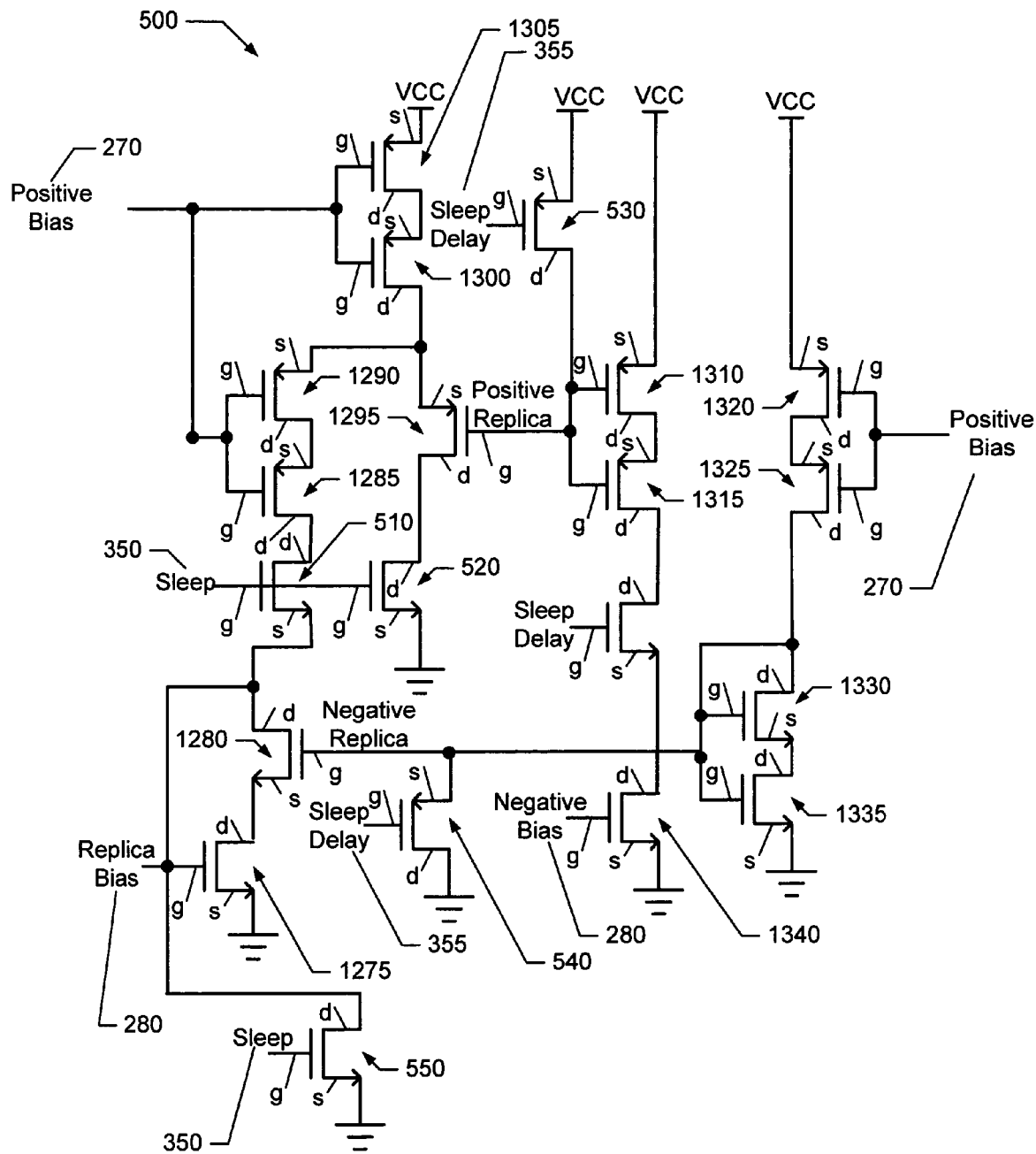

Turning to FIG. 3c, an alternative replica circuit 500 in accordance with various embodiments of the present invention is shown. Replica circuit 400 includes transistors 1275, 1280, 1285, 1290, 1295, 1300, 1310, 1315, 1320, 1325, 1330, 1335 as previously described in relation to class AB bias circuit 221, and additionally transistors 510, 520, 530, 540 each with a source (labeled 's'), a drain (labeled 'd') and a gate (labeled 'g'). Transistor 510, transistor 520 and transistor 550 are used to disable replica circuit 500 whenever sleep control signal 350 is asserted high. In particular, transistor 510 is electrically coupled between the drain of transistor 1285 and the drain of transistor 1280. Transistor 520 is electrically coupled between the drain of transistor 1295 and ground. Transistor 550 is electrically coupled between the gate of transistor 1275 and ground.

Transistor 530 and transistor 540 are operable to assure stability of replica circuit 500 as sleep control signal 350 (via sleep delay 355) is transitioned from an asserted state to a de-asserted state (i.e., as replica circuit 500 is transitioned to an operational state from a sleep state). In particular, transistor 530 is electrically coupled between the power supply and the gate of transistor 1310. Transistor 540 is electrically coupled between the gate of transistor 1280 and ground.

In conclusion, the present invention provides novel systems, methods and arrangements for source follower circuits. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A compound source follower circuit, wherein the compound source follower circuit comprises:
   an input transistor, wherein a gate of the input transistor is electrically coupled to an input;
   a positive drive transistor;
   a negative drive transistor;
   an output, wherein the output is electrically coupled to both the negative drive transistor and to the positive drive transistor;
   a capacitor, wherein the capacitor couples the negative drive transistor to the positive drive transistor; and
   a dynamic bias circuit, wherein the dynamic bias circuit is operable to vary a voltage difference between the positive drive transistor and the negative drive transistor sufficient to sustainably adjust an output drive to respond to a change in quiescent load.

2. The compound source follower circuit of claim 1, wherein the circuit further comprises:
   a high impedance load, wherein the high impedance load is operable to provide a controlled quiescent current to the input transistor.

3. The compound source follower of claim 1, wherein the active bias circuit includes a class AB bias circuit and a replica circuit.

4. The compound source follower of claim 3, wherein the replica circuit is operable to provide a bias signal to the class AB bias circuit, and wherein the replica circuit includes:
   a first transistor with a gate, a drain and a source; wherein the gate of the first transistor is electrically coupled to a positive bias; and wherein the source of the first transistor is electrically coupled to a power source;
   a second transistor with a gate, a drain and a source; wherein the gate of the second transistor is electrically coupled to a positive bias; and wherein the source of the second transistor is electrically coupled to the drain of the first transistor;
   a third transistor with a gate, a drain and a source; wherein the drain of the third transistor is electrically coupled to the bias signal from the replica circuit, and to the drain of the second transistor;
   a fourth transistor with a gate, a drain and a source; wherein the gate of the fourth transistor is electrically coupled to the bias signal from the replica circuit, and to the drain of the third transistor; wherein the source of the fourth transistor is electrically coupled to ground; and wherein the drain of the fourth transistor is electrically coupled to the source of the third transistor;
   a fifth transistor with a gate, a drain and a source; wherein the gate of the fifth transistor is electrically coupled to the gate of the third transistor; wherein the source of the fifth transistor is electrically coupled to ground; and wherein the drain of the fifth transistor is electrically coupled to the gate of the fifth transistor;
   a sixth transistor with a gate, a drain and a source; wherein the source of the sixth transistor is electrically coupled to the source of the second transistor; and wherein the drain of the sixth transistor is electrically coupled to ground;
   a seventh transistor with a gate, a drain and a source; wherein the gate of the seventh transistor is electrically coupled to the gate of the sixth transistor; wherein the source of the seventh transistor is electrically coupled to the power source;
   an eighth transistor with a gate, a drain and a source; wherein the gate of the eighth transistor is electrically coupled to a negative bias; wherein the source of the eighth transistor is electrically coupled to ground; and wherein the drain of the eighth transistor is electrically coupled to the drain of the seventh transistor; and
   a ninth transistor with a gate, a drain and a source; wherein the gate of the ninth transistor is electrically coupled to the positive bias; wherein the source of the ninth transistor is electrically coupled to the power source; and wherein the drain of the ninth transistor is electrically coupled to the drain of the fifth transistor.

5. The compound source follower of claim 4, wherein the replica circuit further includes:
   one or more transistors operable to disable the replica circuit when a sleep mode is selected.

6. The compound source follower of claim 5, wherein the replica circuit further includes:
   one or more transistors operable to delay operation of the replica circuit until some time period after the sleep mode is unselected.

7. The compound source follower of claim 3, wherein the replica circuit is operable to provide a bias signal to the class AB bias circuit, and wherein the class AB bias circuit includes:
   a first transistor with a gate, a drain and a source; wherein the gate of the first transistor is electrically coupled to a positive bias; and wherein the source of the first transistor is electrically coupled to a power source;
   a second transistor with a gate, a drain and a source; wherein the gate of the second transistor is electrically coupled to a positive bias; and wherein the source of the second transistor is electrically coupled to the drain of the first transistor;
   a third transistor with a gate, a drain and a source; wherein the drain of the third transistor is electrically coupled to the gate of the third transistor and to the drain of the second transistor; wherein the gate of the third transistor is electrically coupled to the drain of the third transistor; and wherein the gate of the third transistor is electrically coupled to a negative drive signal provided to the source follower circuit;
   a fourth transistor with a gate, a drain and a source; wherein the drain of the fourth transistor is electrically coupled to the source of the third transistor; wherein the source of the fourth transistor is electrically coupled to ground; and wherein the gate of the fourth transistor is electrically coupled to the bias signal from the replica circuit;
   a fifth transistor with a gate, a drain and a source; wherein the gate of the fifth transistor is electrically coupled to a positive drive signal provided to the source follower circuit; wherein the drain of the fifth transistor is electrically coupled to an output bias signal provided to the source follower circuit; and wherein the source of the fifth transistor is electrically coupled to the drain of the first transistor; and
   a sixth transistor with a gate, a drain and a source; wherein the gate of the sixth transistor is electrically coupled to the positive bias; wherein the source of the sixth transistor is electrically coupled to the drain of the third transistor; and wherein the drain of the sixth transistor is electrically coupled to the drain of the third transistor.

8. The compound source follower of claim 7, wherein the class AB bias circuit further includes:
   one or more transistors operable to disable the class AB bias circuit when a sleep mode is selected.

9. The compound source follower of claim 8, wherein the class AB bias circuit further includes:
   one or more transistors operable to delay operation of the class AB bias circuit until some time period after the sleep mode is unselected.

10. A class AB source follower circuit, wherein the circuit comprises:
    a source follower circuit, wherein the source follower circuit is actively biased with an active bias operable to allow the source follower circuit to both sustainably sink and source DC current.

11. The class AB follower circuit of claim 10, wherein an output of the source follower circuit is operable to provide an output current greater than the quiescent current.

12. The class AB follower circuit of claim 10, wherein the circuit is further operable to both sink and source AC current.

13. The class AB follower circuit of claim 10, wherein the source follower circuit is biased with a bias circuit; wherein the bias circuit includes both a class AB bias circuit, and a replica circuit; and wherein the replica circuit is operable to provide a bias signal to the class AB bias circuit.

14. The class AB follower circuit of claim 13, wherein the class AB bias circuit includes:
   a first transistor with a gate, a drain and a source; wherein the gate of the first transistor is electrically coupled to a positive bias; and wherein the source of the first transistor is electrically coupled to a power source;
   a second transistor with a gate, a drain and a source; wherein the gate of the second transistor is electrically coupled to a positive bias; and wherein the source of the second transistor is electrically coupled to the drain of the first transistor;
   a third transistor with a gate, a drain and a source; wherein the drain of the third transistor is electrically coupled to the gate of the third transistor and to the drain of the second transistor; wherein the gate of the third transistor is electrically coupled to the drain of the third transistor; and wherein the gate of the third transistor is electrically coupled to a negative drive signal provided to the source follower circuit;
   a fourth transistor with a gate, a drain and a source; wherein the drain of the fourth transistor is electrically coupled to the source of the third transistor; wherein the source of the fourth transistor is electrically coupled to ground; and wherein the gate of the fourth transistor is electrically coupled to the bias signal from the replica circuit;
   a fifth transistor with a gate, a drain and a source; wherein the gate of the fifth transistor is electrically coupled to a positive drive signal provided to the source follower circuit; wherein the drain of the fifth transistor is electrically coupled to an output bias signal provided to the source follower circuit; and wherein the source of the fifth transistor is electrically coupled to the drain of the first transistor; and
   a sixth transistor with a gate, a drain and a source; wherein the gate of the sixth transistor is electrically coupled to the positive bias; wherein the source of the sixth transistor is electrically coupled to the drain of the third transistor; and wherein the drain of the sixth transistor is electrically coupled to the drain of the third transistor.

15. The class AB follower circuit of claim 14, wherein the class AB bias circuit further includes:
   one or more transistors operable to disable the class AB bias circuit when a sleep mode is selected.

16. The class AB follower circuit of claim 15, wherein the class AB bias circuit further includes:
   one or more transistors operable to delay operation of the class AB bias circuit until some time period after the sleep mode is unselected.

17. The class AB follower circuit of claim 13, wherein the replica circuit includes:
   a first transistor with a gate, a drain and a source; wherein the gate of the first transistor is electrically coupled to a positive bias; and wherein the source of the first transistor is electrically coupled to a power source;
   a second transistor with a gate, a drain and a source; wherein the gate of the second transistor is electrically coupled to a positive bias; and wherein the source of the second transistor is electrically coupled to the drain of the first transistor;
   a third transistor with a gate, a drain and a source; wherein the drain of the third transistor is electrically coupled to the bias signal from the replica circuit, and to the drain of the second transistor;
   a fourth transistor with a gate, a drain and a source; wherein the gate of the fourth transistor is electrically coupled to the bias signal from the replica circuit, and to the drain of the third transistor; wherein the source of the fourth transistor is electrically coupled to ground; and wherein the drain of the fourth transistor is electrically coupled to the source of the third transistor;
   a fifth transistor with a gate, a drain and a source; wherein the gate of the fifth transistor is electrically coupled to the gate of the third transistor; wherein the source of the fifth transistor is electrically coupled to ground; and wherein the drain of the fifth transistor is electrically coupled to the gate of the fifth transistor;
   a sixth transistor with a gate, a drain and a source; wherein the source of the sixth transistor is electrically coupled to the source of the second transistor; and wherein the drain of the sixth transistor is electrically coupled to ground;
   a seventh transistor with a gate, a drain and a source; wherein the gate of the seventh transistor is electrically coupled to the gate of the sixth transistor; wherein the source of the seventh transistor is electrically coupled to the power source;
   an eighth transistor with a gate, a drain and a source; wherein the gate of the eighth transistor is electrically coupled to a negative bias; wherein the source of the eighth transistor is electrically coupled to ground; and wherein the drain of the eighth transistor is electrically coupled to the drain of the seventh transistor; and
   a ninth transistor with a gate, a drain and a source; wherein the gate of the ninth transistor is electrically coupled to the positive bias; wherein the source of the ninth transistor is electrically coupled to the power source; and wherein the drain of the ninth transistor is electrically coupled to the drain of the fifth transistor.

18. The class AB follower circuit of claim 17, wherein the replica circuit further includes:
   one or more transistors operable to disable the replica circuit when a sleep mode is selected.

19. The class AB follower circuit of claim 18, wherein the replica circuit further includes:
   one or more transistors operable to delay operation of the replica circuit until some time period after the sleep mode is unselected.

20. A method for implementing a class AB source follower circuit, wherein the method comprises:
   providing a source follower circuit; and
   dynamically biasing the source follower circuit such that the source follower circuit is capable of both sustainably sinking and sourcing DC current.

* * * * *